United States Patent [19]

Andrews, Jr. et al.

[11] 4,384,757
[45] May 24, 1983

[54] TERMINAL FOR CONNECTING A CERAMIC CHIP TO A PRINTED CIRCUIT BOARD

[75] Inventors: Howard W. Andrews, Jr., Hershey; Robert F. Cobaugh, Elizabethtown, both of Pa.

[73] Assignee: AMP Incorporated, Harrisburg, Pa.

[21] Appl. No.: 217,932

[22] Filed: Dec. 18, 1980

[51] Int. Cl.³ .................... H01R 9/09; H01R 13/405
[52] U.S. Cl. .......................... 339/258 R; 339/17 C; 339/17 M; 339/221 R
[58] Field of Search ............ 339/17 C, 17 L, 17 LM, 339/17 M, 221 R, 258 R, 258 P, 258 F, 275 R, 275 B, 275 T, 276 SF

[56] References Cited

U.S. PATENT DOCUMENTS

| | | | |
|---|---|---|---|
| 3,066,367 | 12/1962 | Garman | 24/81 |
| 3,479,634 | 11/1969 | Pritulsky | 339/17 |
| 3,764,955 | 10/1973 | Ward | 339/65 |
| 3,853,377 | 12/1974 | Shlesinger | 339/17 C |
| 3,877,769 | 4/1975 | Berg et al. | 339/17 R |
| 3,941,442 | 3/1976 | Friend | 339/17 M |
| 4,028,794 | 6/1977 | Ritchie et al. | 339/17 M |
| 4,070,077 | 1/1978 | Clark | 339/17 C |
| 4,161,346 | 7/1979 | Cherian et al. | 339/17 M |

OTHER PUBLICATIONS

IBM Technical Disclosure Bulletin, Heath et al., "Coaxial Connector", vol. 21, No. 10.

*Primary Examiner*—John McQuade
*Assistant Examiner*—Gary F. Paumen
*Attorney, Agent, or Firm*—Allan B. Osborne

[57] ABSTRACT

The present invention relates to a terminal which may be attached to a ceramic chip or other type substrate and which may be plugged into a PCB and thereby provide electrical connections between the substrate and the conductive traces on the board. More particularly, the terminal includes a receptacle for receiving the edge of a chip for mechanical retention and electrical contact, a spring member which protects the chip from thermal and mechanical stresses, means for insertion into a board's plated-through hole, and means establishing redundant short electrical paths between the pad on the chip and the traces on the PCB. Further, the terminal may be encapsulated in an elastomeric material which provides additional spring resiliency and also provides an environmental seal.

3 Claims, 7 Drawing Figures

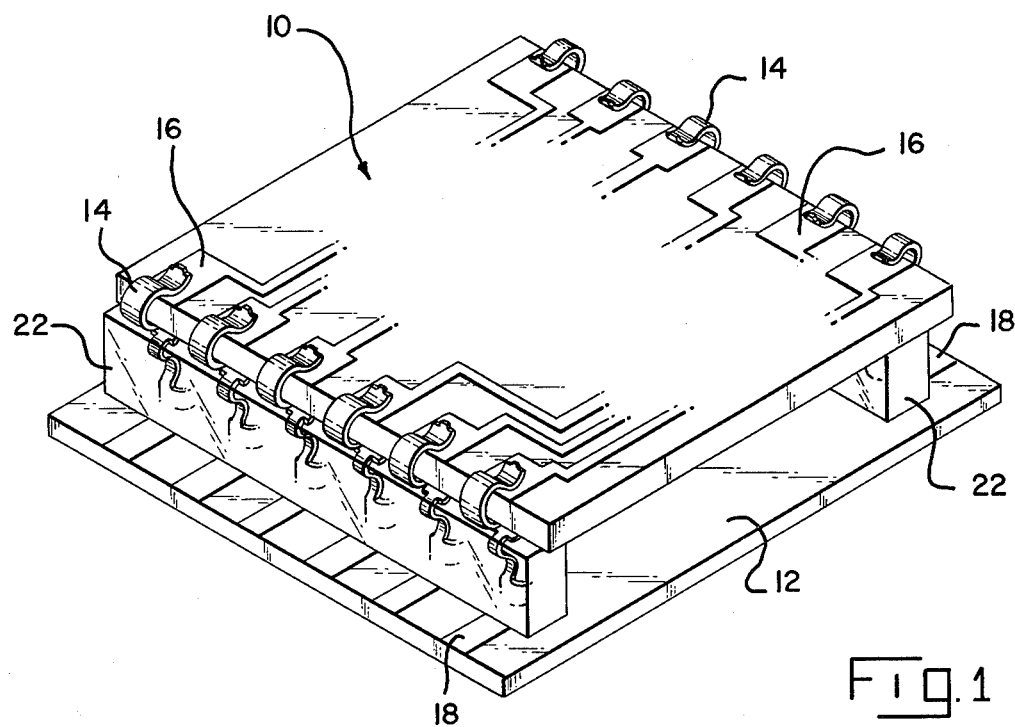
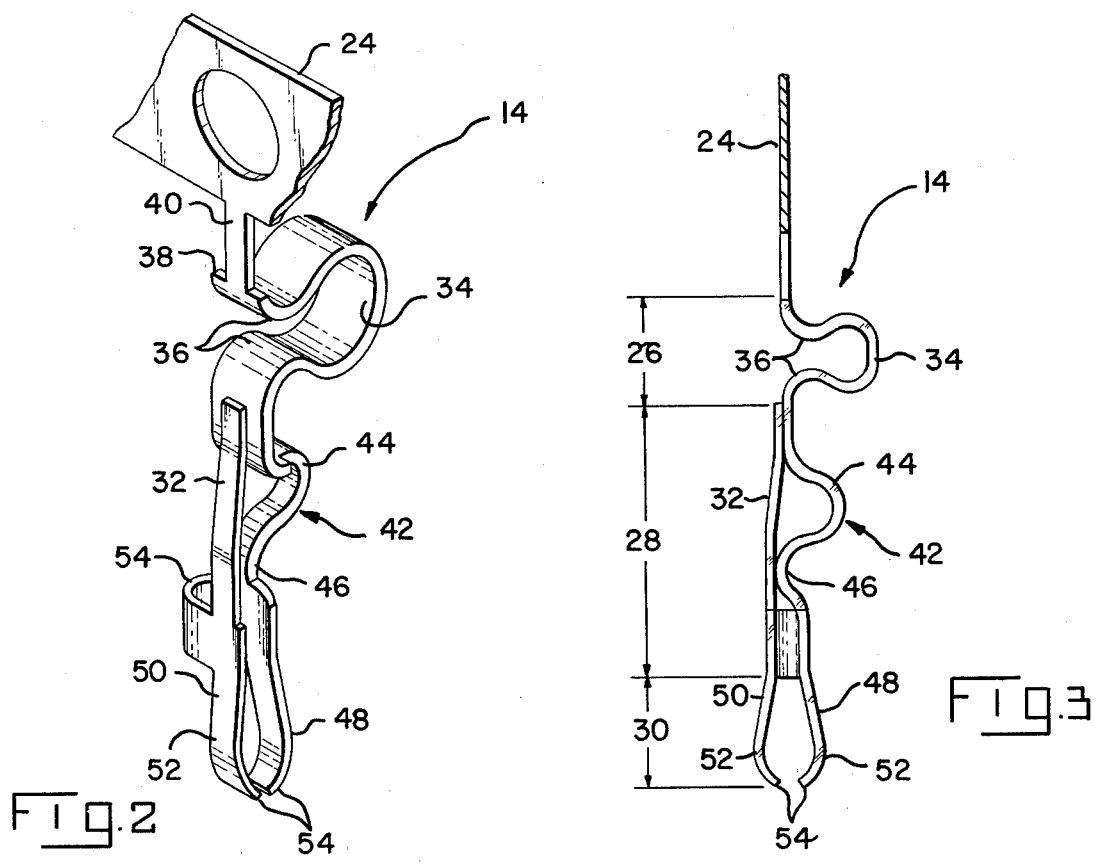

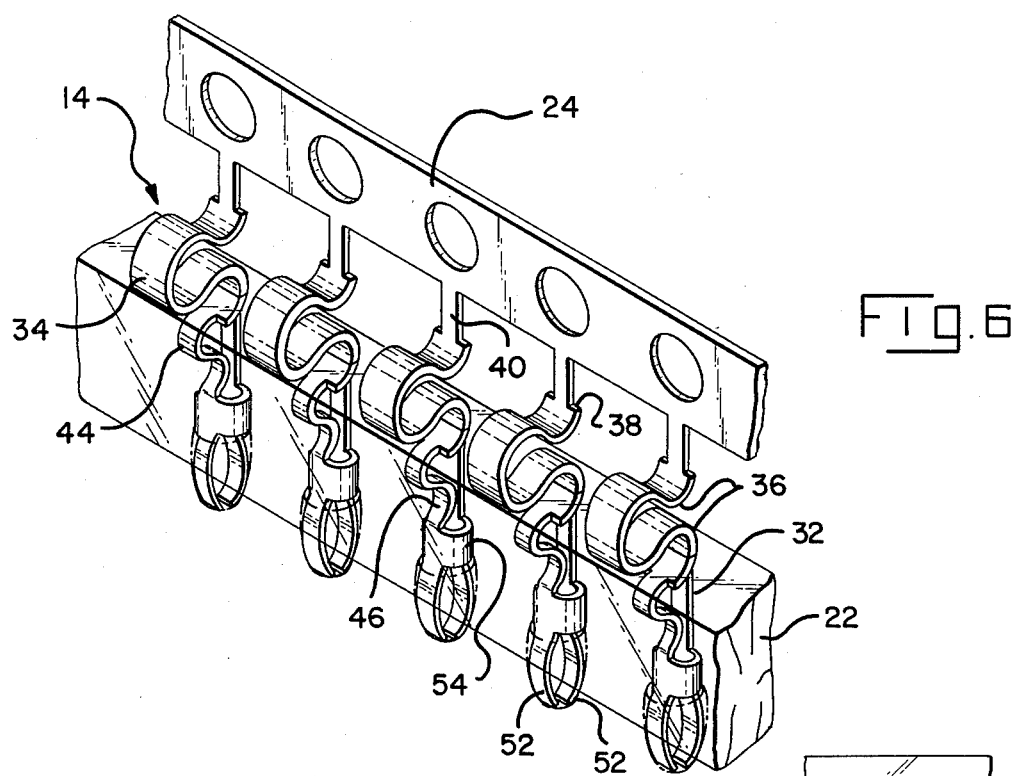
Fig. 6
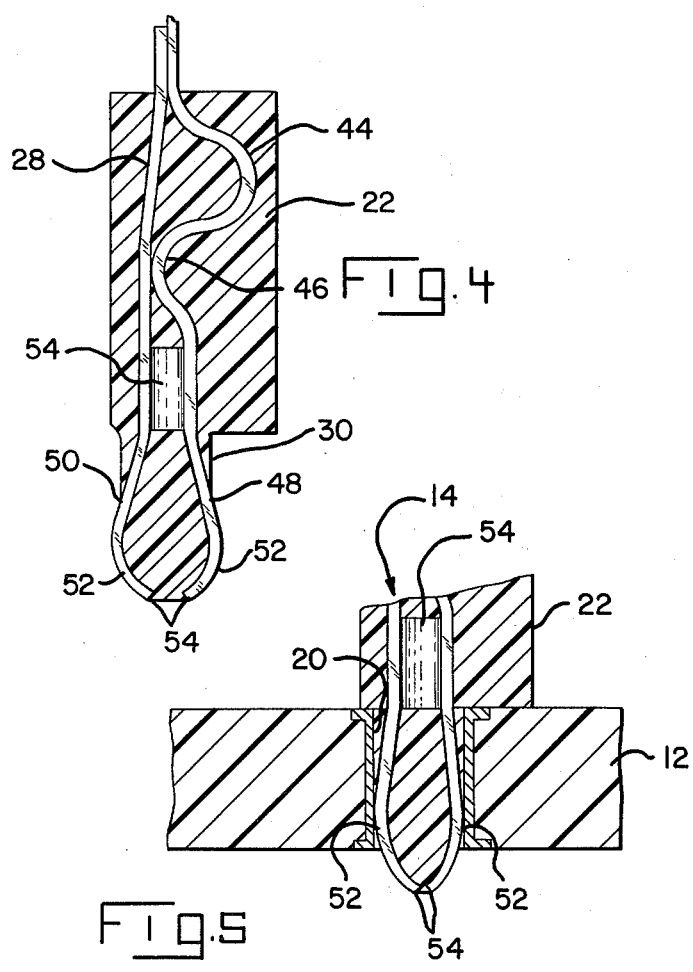
Fig. 4
Fig. 5
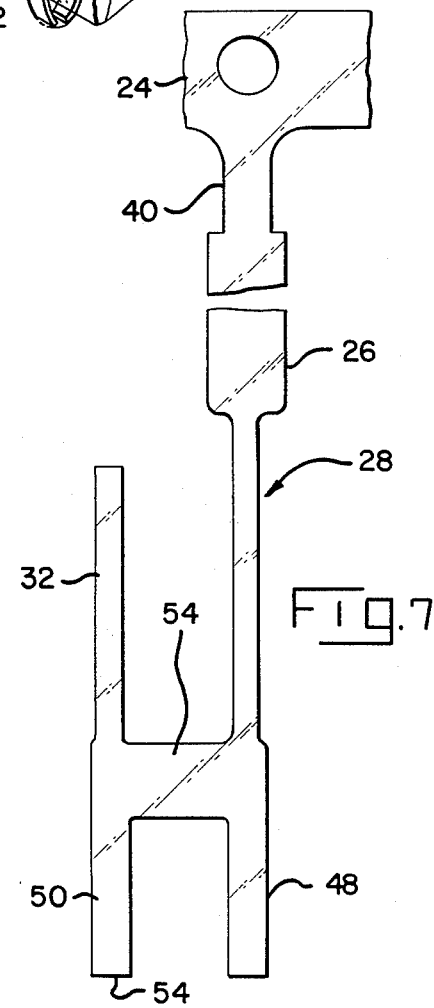
Fig. 7

TERMINAL FOR CONNECTING A CERAMIC CHIP TO A PRINTED CIRCUIT BOARD

BACKGROUND OF THE INVENTION

1. The Field of the Invention

The present invention relates to electrical devices useful for interconnecting circuitry between an active device substrate, such as a ceramic integrated circuit chip, and a printed circuit or wiring board.

2. The Prior Art

The present invention is a novel improvement and a departure from at least the following:

| Patent No. | Patentee | Class/Subclass |
|---|---|---|
| 3,479,634 | Pritulsky | 339/17 |
| 3,764,955 | Ward | 339/65 |
| 3,877,769 | Berg | 339/17R |

Solid state electronic chips such as microprocessors are generally mounted on a substrate of ceramic material. Metallized lines on the substrate provide electrical paths from the very small terminal areas on the electronic chip to larger size pads on the edges of the substrate. The larger size pads more easily facilitate the electrical connections to be made between the substrate and the conductive paths or "traces" on a printed circuit board. The aforementioned prior art patents disclose two connectors for making such electrical connections. In Pritulsky, although the connection is made between a PCB and wires attached to a radio or TV receiver, the connector disclosed can, with little modification, be used to electrically and mechanically connect a substrate to a PCB. The connector of conductive material includes two spaced apart arms bent to provide facing surfaces between which an edge of a PCB is received. The lower member contacts a trace or circuitry on the board edge. Legs integral with the members are adapted for insertion into an aperture on a board of insulative material secured to a radio chassis. Means are included in the connector to receive and terminate wires through which signals are sent to and received from the PCB.

Ward discloses a device specifically designed for holding a substrate and electrically connecting the pads thereon to traces on a PCB. Two spaced apart ears on the device are bent in towards each other and then back in parallel to provide two surfaces between which the edge of the substrate is received. A post integral with the ears is adapted for insertion into a plated-through hole in a PCB to complete the electrical connection.

Berg discloses a circuit board socket into which he adds silicone rubber to the lead or pin-receiving opening. The rubber upon curing completely seals the opening so as to prevent flux, molten solder or other contaminants from entering into the interior of the socket. Further, upon inserting the lead or pin into the socket, the rubber, being resilient, is easily displaced and forms a seal around the pin. Upon withdrawing the pin, the rubber closes to again seal the opening in the socket.

SUMMARY OF THE INVENTION

The present invention discloses a stamped and formed conductive terminals having a receptacle for receiving and holding an edge of a ceramic chip and insertion means whereby the terminals may be plugged into plated-through holes on a PCB. Further, the terminal has a spring member which provides stress-absorbing capabilities.

With circuit speeds being in nanoseconds, it is imperative that the electrical path between the chip and board be as short as possible. Accordingly, the terminal of the present invention includes redundant means which provides a very short path without sacrificing other novel and desirable features noted above.

Additionally, embedding the terminal in an elastomer is disclosed. The elastomer provides a resilient backing for the spring members on the terminal which are inserted into plated-through holes on the printed circuit board.

BRIEF DESCRIPTION OF THE DRAWINGS

FIG. 1 is a perspective view of a ceramic integrated circuit chip having terminals of the present invention attached thereto to form an assembly which is shown plugged into a PCB;

FIG. 2 is a perspective view of a terminal of FIG. 1;

FIG. 3 is a side view of the terminal of FIG. 2;

FIG. 4 is a side view of a terminal embedded in an elastomeric material;

FIG. 5 is a view of the terminal of FIG. 5 inserted into a printed circuit board;

FIG. 6 shows a continuous length of elastomeric material embedding a strip of terminals; and FIG. 7 is a blank of the terminal prior to being formed.

DESCRIPTION OF THE INVENTION

In FIG. 1 a ceramic integrated circuit chip 10 is mechanically held and electrically connected to PCB 12 by a plurality of terminals 14 made in accordance with the present invention. The terminals electrically connect conductive pads 16 on chip 10 to traces 18 on the PCB. These traces extend from plated-through holes 20 (FIG. 5) into which the terminals have been inserted. In the embodiment shown in FIGS. 1 and 4-6, the terminals have been, for the most part, embedded in a length of elastomeric material indicated by reference numeral 22.

With reference now to FIGS. 2 and 3, terminals 14 will be described.

The preferred method of making terminals 14 is by stamping and forming them from coplanar stock metal in a continuous strip. Carrier strip 24 guides the terminals through the stamping and forming dies, plating lines, reeling (none of which are shown) and further, provides a convenient means for gang attaching a strip of terminals to a chip 10 and for gang insertion into board 12. Subsequent to such attaching and inserting, the carrier strip is easily broken off to electrically and mechanically isolate the terminals, one from the other.

The preferred metal is copper alloy (the alloy being nickel and tin) with a tin plating.

Functionally and structurally the terminals have four sections: top section 26, intermediate section 28, lower section 30 and shorting bar 32.

Top section 26 includes a C-shaped receptacle 34, the arms of which have facing contacts 36 which engages the pads on chip 10. The curved portion of the receptacle between and connecting the two arms provide spring means for biasing the contacts towards each other. The spring pressure ensures a tight physical abutment between the pads and contacts and hence a good electrical path therebetween is provided.

Free end 38 of the receptacle curves up and is attached to carrier strap 40 which connects the terminal to carrier strip 24. The point of attachment is preferably scored (not shown) to facilitate breaking the carrier strip and strap away from the terminal.

As shown in the drawings, the C-shaped receptacle on terminal 14 grasps the edge of chip 10 and lower section 30 is inserted into a hole in the board. Thus, the two ends of the terminal are basically fixed. As is well known in the industry, printed circuit boards are subject to mechanical and thermal stresses. Warpage of the board is a common occurrence from such stresses. Further, heat generated by the electrical components on a ceramic chip and other devices, can induce thermal stresses. With the two ends of a connecting terminal being generally rigid, the aforementioned stresses and warpage can cause non-functioning and breakage of the chips and other devices. Accordingly, the present invention includes intermediate section 28 which has a flex-absorbing function to protect the attached chip and the integrity of the electrical connection with the board. The flex-absorbing function is preformed by an S-shaped member 42 of the intermediate section 28. Member 42, which consists of upper and lower concavo-convex portions 44 and 46 respectively, is reduced in width relative to the above top section 26 and below lower section 30. The S-shape and thinner width combines to make the intermediate section resilient so as to absorbing flexing incoming from either above or below. Warpage of the board, for example, is transmitted to and absorbed by the S-shaped member without damage to the attached chip.

Lower section 30 includes a pair of spaced apart, parallel, resilient legs 48 and 50. Each leg has a spring portion 52 curving outwardly with the concave surfaces facing inwardly. The free ends 54 of the legs are converging in towards one another. The two legs are connected together by strap 54 which is located at the top of the lower section so as not to interfere with leg movement. The strap is attached to an edge of each leg and serves a second function; i.e., a stop for the terminal as it is being inserted into board 12.

Shorting bar 32 is attached to the top of leg 50 and extends upwardly to the top of the intermediate section. It is pre-loaded to press against concavo-convex portion 46 as well as the top of section 28. Bar 32 provides a shorter electrical path between contacts 32 and legs 48-50 as compared to one through the S-shaped member of the intermediate section.

FIGS. 1, and 4-6 show elastomeric material 22 encasing terminals 14. Preferably the elastomer is a silicone rubber which can be injected as a continuous strip around the terminals as shown in FIGS. 1 and 6. The nature and extent of encasing the terminals can best be seen in FIG. 4. The intermediate section is completely embedded as is the upper portion of the lower section. The space between legs 48 and 50 is filled with elastomer 22 but the outer surfaces from spring portions 52 down to free ends 54 are exposed.

FIG. 5 is a cross-sectional view showing a terminal plugged into plated-through hole 20 in printed circuit board 12. Note that the bare or exposed surfaces on spring portions 52 are in contact with the walls of hole 20.

Some features of the elastomer material includes surrounding the upper portion of the legs so that it fills in the space between the upper reaches of the plated-through hole and lower section. An environmental seal is provided thereby. Further, the elastomeric material between legs 48 and 50 reinforce and complement the spring force of the legs. Accordingly, a greater spring force requirement can be met without increasing leg size. Alternatively, leg material volume can be reduced where a lesser spring force is required.

Also, the elastomeric material surrounds intermediate section 28 to complement the resiliency of its S-shaped member 42 in the same manner as the material complements legs 48 and 50. Acting in concert with the intermediate section, the material will absorb circuit board flexures.

FIG. 6 shows several terminals 14 attached to carrier strip 24. Elastomeric material 22 has been injected around the terminals in the manner described above with reference to FIGS. 4 and 5. The length of terminals may be simultaneously attached to one edge of a chip, another length attached to a second edge and that assembly plugged into a printed circuit board. Thereafter, carrier strip 24 may be broken away to isolate the terminals from each other.

FIG. 7 shows a terminal 14 blanked out but not formed. The several structural parts of the terminal are referenced, using the same numerals as used in the other drawings so that correlation therebetween is easily made.

The present invention may be subject to many modifications and changes without departing from the spirit or essential characteristics thereof. The present embodiment should therefore be considered in all respects as illustrative and not restrictive of the scope of the invention.

What is claimed is:

1. A terminal of conductive material for mounting and electrically connecting a ceramic chip to a printed circuit board, said terminal comprising:
   a. a top section having a C-shaped receptacle for receiving an edge of a ceramic chip;
   b. a lower section having a first and second, spaced-apart, curved legs with the free ends thereof converging towards each other and with the second leg being attached to the first leg by a strap attached to an edge of each, said two legs being adapted for insertion into a plated-through hole in a printed circuit board for electrical connection therewith;
   c. an intermediate section connected to and extending between the top and lower sections, said intermediate section having an S-shaped member of greater resiliency than the top and lower sections, said S-shaped member adapted to absorb thermal and mechanical stresses entering the terminal at either end; and
   d. a shorting bar attached to the second leg and extending upwardly, said bar bearing against the upper portion of the intermediate section to thereby establish an electrical path bypassing the S-shaped member.

2. The terminal of claim 1 further including an elastomeric material positioned in between the first and second legs, said elastomeric material complementing the resiliency of the legs.

3. The terminal of claim 2 further including an elastomeric material encasing the intermediate section.

* * * * *